(12) United States Patent
Hwang et al.

(10) Patent No.: US 10,051,094 B2
(45) Date of Patent: *Aug. 14, 2018

(54) TRANSMITTING APPARATUS, RECEIVING APPARATUS, AND SIGNAL PROCESSING METHOD THEREOF

(71) Applicant: SAMSUNG ELECTRONICS CO., LTD., Gyeonggi-do (KR)

(72) Inventors: Sung-hee Hwang, Suwon-si (KR); Alain Mourad, Staines (GB); Hyun-koo Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/271,838

(22) Filed: Sep. 21, 2016

(65) Prior Publication Data

US 2017/0013094 A1    Jan. 12, 2017

Related U.S. Application Data

(63) Continuation of application No. 14/476,872, filed on Sep. 4, 2014, now Pat. No. 9,485,295.

(30) Foreign Application Priority Data

May 8, 2014    (KR) .................. 10-2014-0054756

(51) Int. Cl.
*H04L 29/06*    (2006.01)
*H04N 21/00*    (2011.01)
(Continued)

(52) U.S. Cl.
CPC ............ *H04L 69/22* (2013.01); *H04L 5/0044* (2013.01); *H04L 65/602* (2013.01);
(Continued)

(58) Field of Classification Search
CPC ..... H04L 69/22; H04L 5/0044; H04L 65/602; H04L 65/607; H04L 65/608;
(Continued)

(56) References Cited

U.S. PATENT DOCUMENTS

2005/0152359 A1    7/2005    Gisberts et al.
2005/0233710 A1    10/2005   Lakkis et al.
(Continued)

FOREIGN PATENT DOCUMENTS

| EP | 2 190 135 A1 | 5/2010 |
|----|--------------|--------|
| EP | 2 555 510 A2 | 2/2013 |
| WO | 2009031863 A2 | 3/2009 |

OTHER PUBLICATIONS

Communication dated Feb. 17, 2017 issued by the European Patent Office in counterpart European Patent Application No. 14842565.5.

(Continued)

*Primary Examiner* — Obaidul Huq
(74) *Attorney, Agent, or Firm* — Sughrue Mion, PLLC

(57) ABSTRACT

A transmitting apparatus, a receiving apparatus and methods of controlling these apparatuses are provided. The transmitting apparatus includes: a baseband packet generator configured to, based on an input stream including a first type stream and a second type stream, generate a baseband packet including a header and payload data corresponding to the first type stream; a frame generator configured to generate a frame including the baseband packet; a signal processor configured to perform signal-processing on the generated frame; and a transmitter configured to transmit the signal-processed frame, wherein the header includes a type of the payload data in the baseband packet and the number of the first type stream packets in the baseband packet.

5 Claims, 18 Drawing Sheets

Related U.S. Application Data

(60) Provisional application No. 61/879,352, filed on Sep. 18, 2013, provisional application No. 61/873,472, filed on Sep. 4, 2013.

(51) Int. Cl.
*H04N 21/236* (2011.01)
*H04L 5/00* (2006.01)
*H04N 21/2383* (2011.01)
*H03M 13/00* (2006.01)
*H04N 21/60* (2011.01)

(52) U.S. Cl.
CPC .......... *H04L 65/607* (2013.01); *H04L 65/608* (2013.01); *H04N 21/00* (2013.01); *H04N 21/2383* (2013.01); *H04N 21/23605* (2013.01); *H03M 13/6552* (2013.01); *H04L 5/0053* (2013.01); *H04N 21/60* (2013.01)

(58) Field of Classification Search
CPC ............................ H04L 5/0053; H04N 21/00; H04N 21/23605; H04N 21/2383; H04N 21/60; H03M 13/6552
USPC ......................................... 370/351, 389, 392
See application file for complete search history.

(56) References Cited

U.S. PATENT DOCUMENTS

| | | |
|---|---|---|
| 2005/0249300 A1 | 11/2005 | Jeong et al. |
| 2007/0076764 A1 | 4/2007 | Kawada et al. |
| 2009/0036061 A1* | 2/2009 | Chun .................... H04W 28/06 455/68 |
| 2009/0168691 A1 | 7/2009 | Fu et al. |
| 2010/0284408 A1 | 11/2010 | Lewis et al. |
| 2011/0154164 A1 | 6/2011 | Seo et al. |
| 2012/0236853 A1* | 9/2012 | Kim .................... H04W 28/065 370/389 |
| 2012/0307842 A1 | 12/2012 | Petrov et al. |
| 2012/0327955 A1 | 12/2012 | Herrmann et al. |
| 2015/0237175 A1 | 8/2015 | Lachlan |

OTHER PUBLICATIONS

International Search Report (PCT/ISA/220) dated Dec. 9, 2014 by the International Searching Authority in related application No. PCT/KR2014/008223.

Written Opinion (PCT/ISA/237) dated Dec. 9, 2014 by the International Searching Authority in related application No. PCT/KR2014/008223.

* cited by examiner

TRANSMITTING APPARATUS, RECEIVING APPARATUS, AND SIGNAL PROCESSING METHOD THEREOF

CROSS-REFERENCE TO RELATED APPLICATIONS

This is a continuation of application Ser. No. 14/476,872 filed Sep. 4, 2014, which claims priority from Korean Patent Application No. 10-2014-0054756, filed in the Korean Intellectual Property Office on May 8, 2014, U.S. Provisional Application No. 61/873,472, filed in the USPTO on Sep. 4, 2013, and the U.S. Provisional Application No. 61/879,352, filed in the USPTO on Sep. 18, 2013, the entire disclosures of which are incorporated herein their entirety by reference.

BACKGROUND

1. Field

Apparatuses and methods consistent with exemplary embodiments of the inventive concept relate to a transmitting apparatus, a receiving apparatus, and a signal processing method thereof, and more particularly, to a transmitting apparatus which maps data with at least one signal processing path and transmitting the same, a receiving apparatus, and a signal processing method thereof.

2. Description of the Related Art

In the information society of 21th century, broadcast communication services have become more digitalized, providing multi-channels and a broadband and high quality service. In particular, as high-resolution digital televisions, portable media players (PMPs), and mobile broadcast devices are widely distributed recently, user's needs for various types of receiving methods for digital broadcast services is increasing.

In order to satisfy the above needs of users, standards groups have developed various types of standards to provide high quality broadcasting services. In this regard, a method for providing better quality broadcasting services through superior performances is required.

SUMMARY

One or more exemplary embodiments provide a transmitting apparatus which generates a frame in an appropriate format to transmit various types of data, a receiving apparatus, and a controlling method thereof.

According to an aspect of an exemplary embodiment, there is provided a transmitting apparatus which may include: a baseband packet generator configured to, based on an input stream including a first type stream and a second type stream, generate a baseband packet including a header and payload data corresponding to the first type stream; a frame generator configured to generate a frame including the baseband packet; a signal processor configured to perform signal-processing on the generated frame; and a transmitter configured to transmit the signal-processed frame, wherein the header includes a type of the payload data in the baseband packet and the number of the first type stream packets in the baseband packet.

The first type stream may be a transport stream (TS), and information regarding the type of the payload data may be information corresponding to the TS.

The second type stream may be at least one of an Internet packet (IP) and a signaling packet.

The header may further include at least one of information regarding whether a null packet removed before the baseband packet exists and information regarding the number of null packets removed before a TS packet group in a payload of the baseband packet and an input stream clock reference in relation with the TS packet group.

The header may include a base header and an option header, the information regarding the type of payload data, the number of the first type stream packets, and whether a null packet removed before the baseband packet may be included in the base header, and the information regarding the number of null packets removed before the TS packet group in the payload and input stream clock reference in relation with the TS packet group may be included in the option header.

The frame including the baseband packet may be a baseband frame, and the signal processor may generate a transmission frame by perform the signal-processing on the baseband frame to map the first type stream and the second type stream to at least one signal processing path.

According to an aspect of another exemplary embodiment, there is provided a receiving apparatus receiving a signal from a transmitting apparatus which maps data included in an input stream including a first type stream and a second type stream to at least one signal processing path and transmits the signal. The receiving apparatus may include: a receiver configured to receive the signal; and a signal processor configured to generate a frame from the received signal, extract header information from a baseband packet, corresponding to the first type stream, included in the frame, and perform signal-processing on payload data included in the baseband packet based on the extracted header information. The header information may include a type of the payload data in the baseband packet and the number of the first type stream packets in the baseband packet.

The first type stream may be a TS, and information regarding the type of the payload data may be information corresponding to the TS.

The second type stream may be at least one of an IP packet and a signaling packet.

The header information may include at least one of information regarding whether a null packet removed before the baseband packet exists and information regarding the number of null packets removed before a TS packet group in a payload of the baseband packet and an input stream clock reference in relation with the TS packet group.

The header information may be included in a base header and an option header. The information regarding the type of payload data, the number of the first type stream packets, and whether a null packet removed before the baseband packet may be included in the base header, and the information regarding the number of null packets removed before the TS packet group in the payload and the input stream clock reference in relation with the TS packet group may be included in the option header.

According to an aspect of still another exemplary embodiment, there is provided a signal processing method of a transmitting apparatus. The method may include: generating a baseband packet including a header and payload data corresponding to a first type stream based on an input stream including the first type stream and a second type stream; generating a frame including the baseband packet; performing signal-processing on the generated frame, and transmitting the signal-processed frame. The header may include a type of the payload data in the baseband packet and the number of the first type stream packets in the baseband packet.

The first type stream may be a TS, and information regarding the type of the payload data may be information corresponding to the TS.

The second type stream may be at least one of an IP packet and a signaling packet.

The header may include at least one of information regarding whether a null packet removed before the baseband packet exists and information regarding the number of null packets removed before a TS packet group in a payload of the baseband packet and an input stream clock reference in relation with the TS packet group.

The header may include a base header and an option header. The information regarding the type of payload data, the number of the first type stream packets, and whether a null packet removed before the baseband packet may be included in the base header, and the information regarding the number of null packets removed before the TS packet group in the payload and input stream clock reference in relation with the TS packet group may be included in the option header.

The frame including the baseband packet may be a baseband frame, and the signal processor may generate a transmission frame by perform the signal-processing on the baseband frame to map the first type stream and the second type stream to at least one signal processing path.

According to an aspect of still another exemplary embodiment, there is provided a signal processing method of a receiving apparatus receiving a signal from a transmitting apparatus which maps data included in an input stream including a first type stream and a second type stream to at least one signal processing path and transmits the signal. The method may include: receiving the signal; generating a frame from the received signal and extracting header information from a baseband packet corresponding to the first type stream included in the frame; and performing signal-processing on payload data included in the baseband packet based on the extracted header information. The header information may include a type of the payload data in the baseband packet and the number of the first type stream packets in the baseband packet.

The first type stream may be a TS stream, and information regarding the type of the payload data may be information corresponding to the TS, and the second type stream may be at least one of an IP packet and a signaling packet.

The header information may include at least one of information regarding whether a null packet removed before the baseband packet exists and information regarding the number of null packets removed before a TS packet group in a payload the baseband packet and an input stream clock reference in relation with the TS packet group.

The header information may be included in a base header and an option header. The information regarding the type of the payload data, the number of the first type stream packets, and whether a null packet removed before the baseband packet may be included in the base header, and the information regarding the number of null packets removed before the TS packet group in the payload and input stream clock reference in relation with the TS packet group may be included in the option header.

According to the exemplary embodiments, various types of data may be mapped to a transmittable physical layer, and data processing efficiency may be improved.

BRIEF DESCRIPTION OF THE DRAWINGS

The above and/or other aspects of the inventive concept will be more apparent by describing exemplary embodiments of the inventive concept with reference to the accompanying drawings, in which.

DETAILED DESCRIPTION OF THE EXEMPLARY EMBODIMENTS

Figure 1:
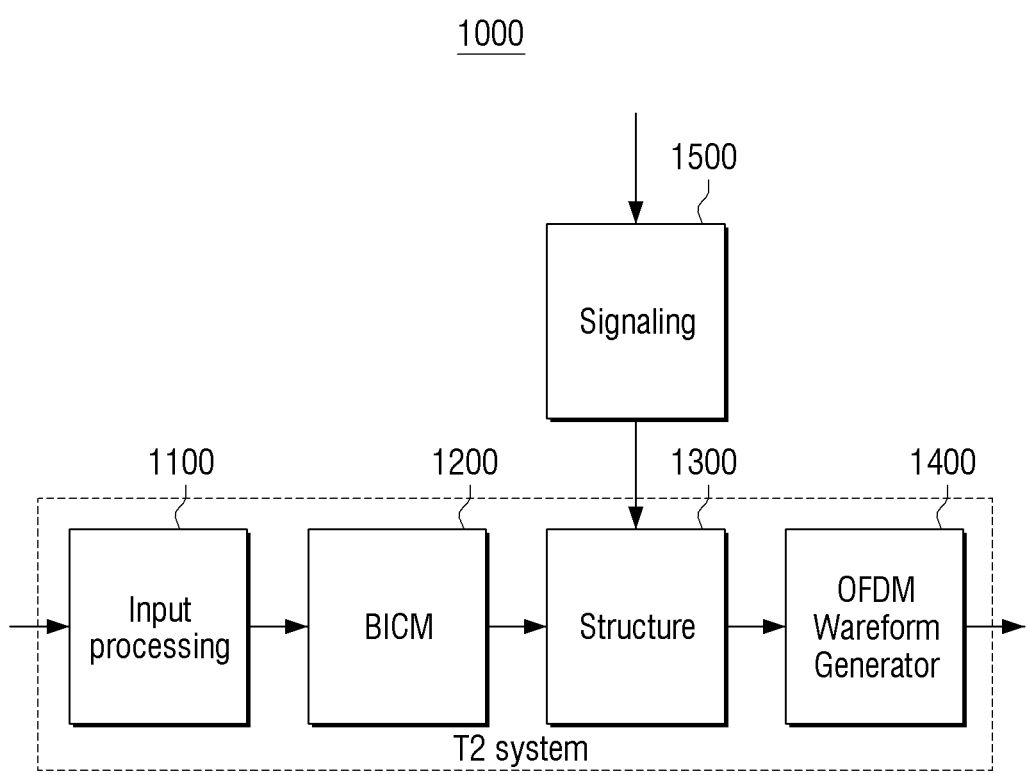
FIG. 1 is a block diagram provided to explain configuration of a transmitting system, according to an exemplary embodiment.

Hereinafter, exemplary embodiments will be described in detail with reference to accompanying drawings. In the following description, same reference numerals are used for analogous elements when they are depicted in different drawings. The matters defined in the description, such as detailed construction and elements, are provided to assist in a comprehensive understanding of the exemplary embodiments. Thus, it is apparent that other exemplary embodiments can be carried out without those specifically defined matters. Also, functions or elements known in the related art are not described in detail since they would obscure the exemplary embodiments with unnecessary detail. Many of terms used in describing the exemplary embodiments may be referred to in the European standard of a second generation digital terrestrial television broadcasting system (DVB-T2).

In the present disclosure, relational terms such as first and second, and the like, may be used to distinguish one entity from another entity, without necessarily implying any actual relationship or order between such entities.

FIG. 1 is a block diagram provided to explain configuration of a transmitting system, according to an exemplary embodiment.

According to FIG. 1, a transmitting system 1000 may include an input processing block 1100, a bit interleaved coding and modulation (BICM) block 1200, a structure block 1300, and an orthogonal frequency division multiplex (OFDM) waveform generator block 1400. According to another exemplary embodiment, the transmitting system 1000 may further include a signaling block 1500.

The input processing block 1100 generates a baseband frame (BBFRAME or BBF) from an input stream regarding data to be serviced. Herein, the input stream may be a transport stream (TS or TS stream), Internet packets (IP) stream, a generic stream (GS), a generic stream encapsulation (GSE), etc.

The BICM block 1200 performs encoding by determining a forward error correction (FEC) coding rate and a constellation order according to an area (e.g., a fixed PHY frame or a mobile PHY frame) where the data to be serviced is transmitted, and performs time interleaving. Signaling information regarding the data to be serviced may be encoded through a separate BICM encoder (not shown) or may be encoded at the same BICM according to another exemplary embodiment.

The structure block 1300 generates a transmission frame by combining the time-interleaved data with signaling information received from the signaling block 1500.

The OFDM waveform generator block 1400 generates an OFDM signal in the time domain regarding the generated transmission frame, modulates the generated OFDM signal into a radio frequency (RF) signal and transmits the same to a receiver.

The signaling information which is combined with the BIDM-processed data in the structure block 1300 according to an exemplary embodiment may include information regarding an input type of the input stream which is input to the input processing block 1100 and other various pieces of information. Hereinafter, various exemplary embodiments will be described with reference to accompanying drawings.

Figure 2:
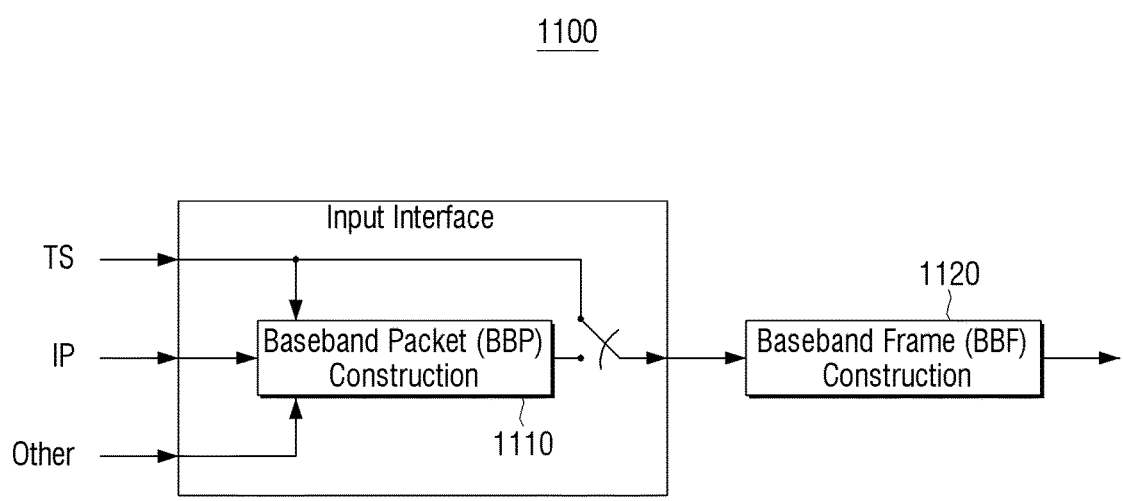
FIG. 2 is a view illustrating an input processing block shown in FIG. 1, according to an exemplary embodiment.

FIG. 2 is a view illustrating an input processing block shown in FIG. 1, according to an exemplary embodiment.

As illustrated in FIG. 2, the input processing block 1100 includes a baseband packet (BBP) construction block 1110 and a baseband frame (BBF) construction block 1120. The BBP construction block 1110 generates a BBP from the input stream of TS, IP or other forms of stream. In this case, the TS stream may be output in its original form without being converted to the form of BBP and thus, a TS packet constituting a TS stream may correspond to a BBP. The BBF construction block 1120 generates a BBF from input of BBPs.

FIGS. 3A to 3D are views provided to explain a unit structure of a transmission frame, according to an exemplary embodiment.

Figure 3A:
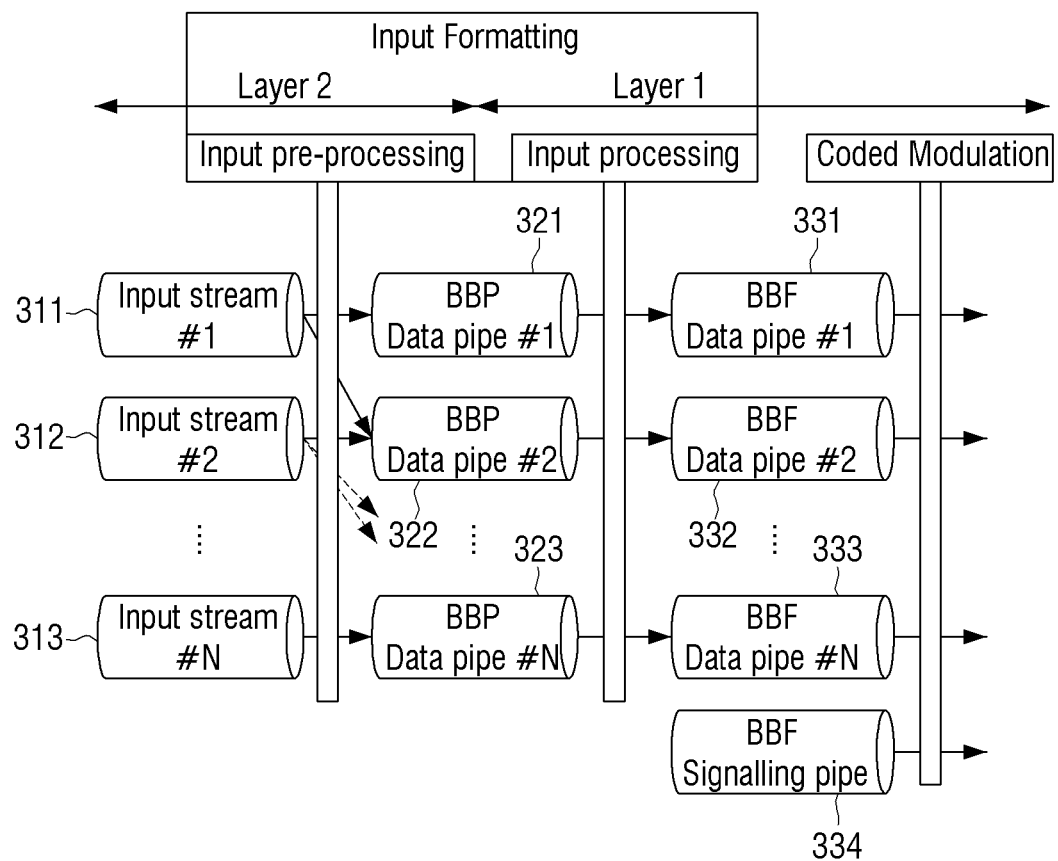
FIGS. 3A to 3D are views provided to explain a unit structure of a transmission frame, according to an exemplary embodiment.

As illustrated in FIG. 3A, an input processing module in which an input stream is processed to a BBF may operate in a data pipe level.

FIG. 3A illustrates processing an input stream to a BBF, and a plurality of input streams 311-313 are processed to data pipes 321-323 for a plurality of BBPs through input pre-processing, and the data pipes 321-323 for the plurality of BBPs are encapsulated to data pipes 331-333 for a plurality of BBFs through input processing, for example, at the input processing block 1100 of FIG. 1, and scheduled for a transmission frame.

Figure 3B:
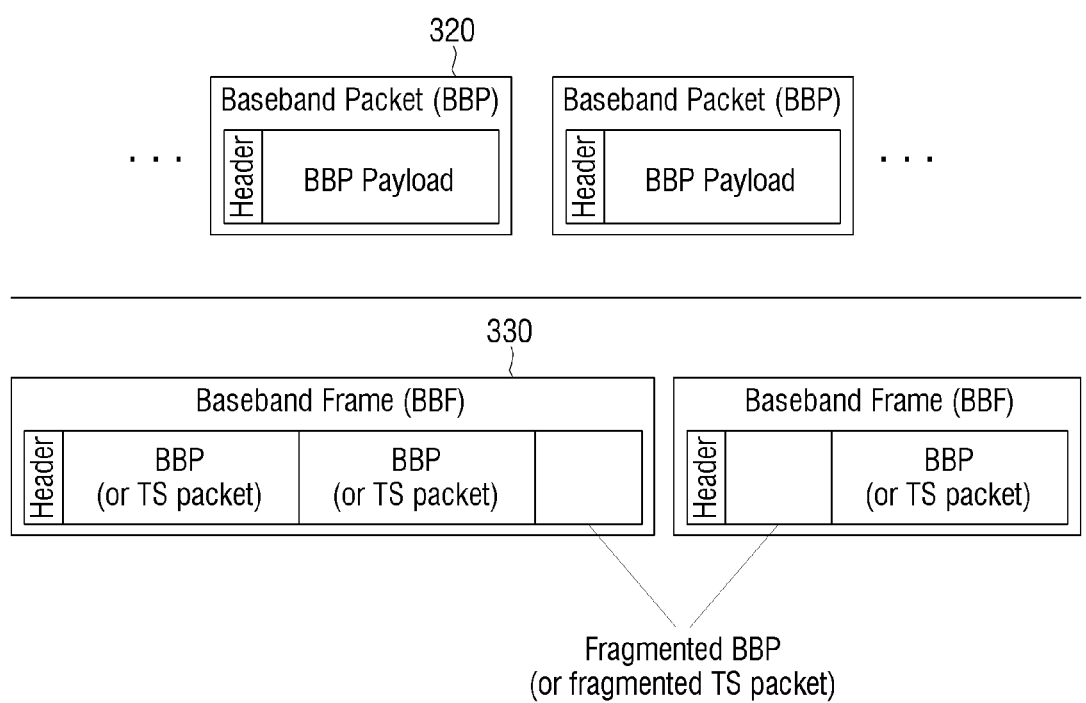

FIG. 3B is a view provided to describe a relationship between a BBP 320 and a BBF 330. A BBP payload of the BBP 320 is a packet constituting a TS, IP or other forms of stream. A BBF 330 may include a plurality of complete BBPs or a fragmented BBP.

Figure 3C:
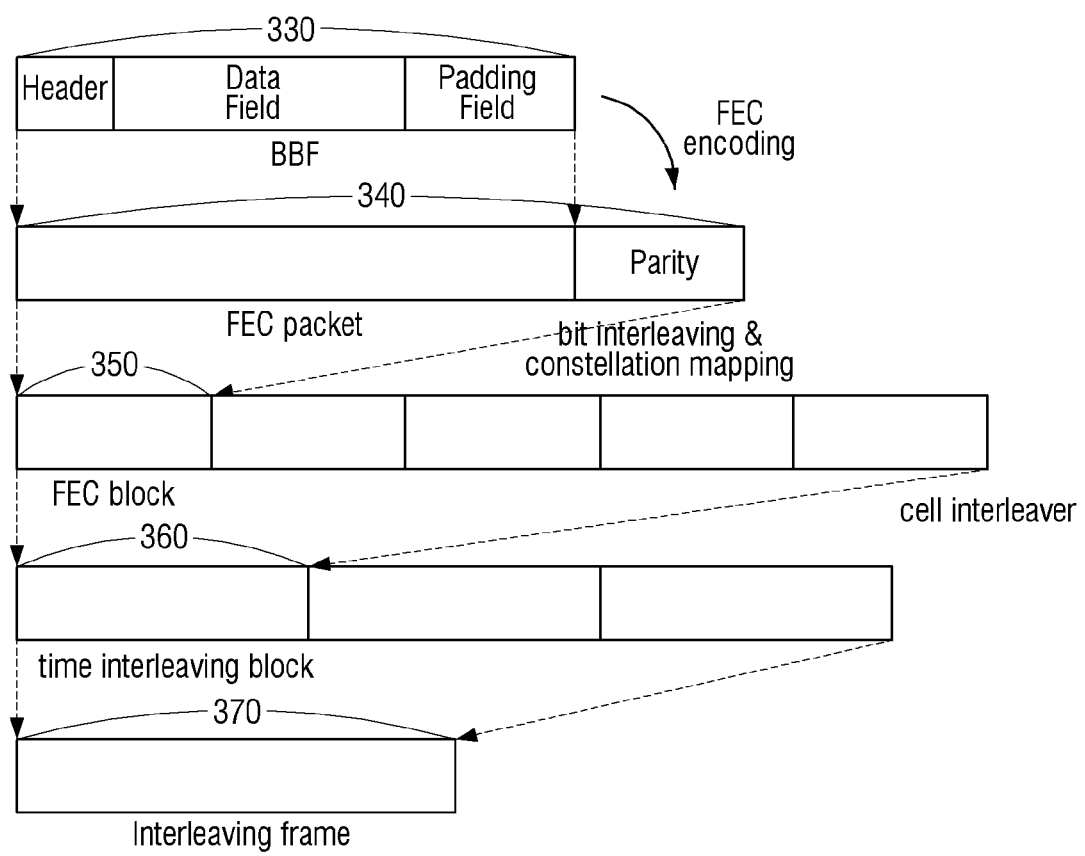

FIG. 3C is a view provided to explain a local frame structure for each physical layer pipe (PLP). Here, the PLP indicates a signal path which is processed independently, and will be explained later in detail.

As illustrated in FIG. 3C, the BBF 330 includes a header, a data field, and a padding field.

The BBF 330 is processed to a BBF FEC packet 340 as a parity is added through an FEC encoding process.

The BBF FEC packet 340 is processed to an FEC block 350 through a bit interleaving process and a constellation mapping process, a plurality of FEC blocks are processed to a time interleaving block 360 through a cell interleaving process, and a plurality of time interleaving blocks constitute an interleaving frame 370.

Figure 3D:
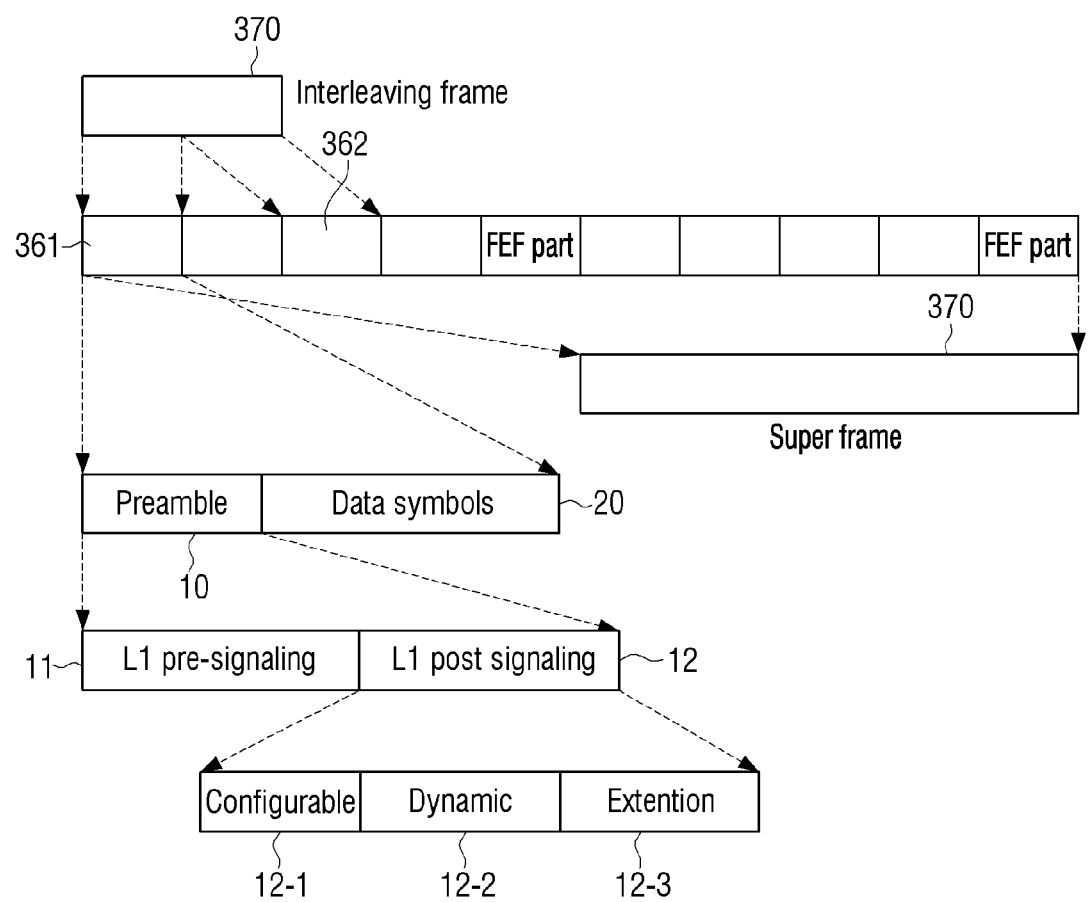

FIG. 3D is a view provided to explain the structure of an interleaving frame.

Referring to FIG. 3D, the interleaving frame 370 may be transmitted through different transmission frames 361, 362, and a plurality of transmission frames and at least one further extension frame (FEF) may form a single superframe 370.

One transmission frame 361 may be formed of a preamble symbol 10 and a data symbol 20 which transmits data.

The preamble symbol 10 includes a layer 1 (L1) pre-signaling area 11 and an L1 post-signaling area 12. The L1 pre-signaling area 11 provides at least one basic transmission parameter including a parameter required to receive and decode L1 post-signaling, and may have a fixed length.

The L1 post-signaling area 12 includes a configurable field 12-1 and a dynamic field 12-2.

The configurable field 12-1 includes information which may change by superframe, and the dynamic field 12-2 includes information which may change by frame unit. A relationship between a superframe and a frame will be described later. Here, the frame may refer to a transmission frame.

The L1 post-signaling area 12 may include an extension field 12-3 selectively. Albeit not illustrated in the drawing, the L1 post-signaling area 12 may further include a cyclic redundancy check (CRC) field and an L1 padding field, if necessary.

Figure 4:
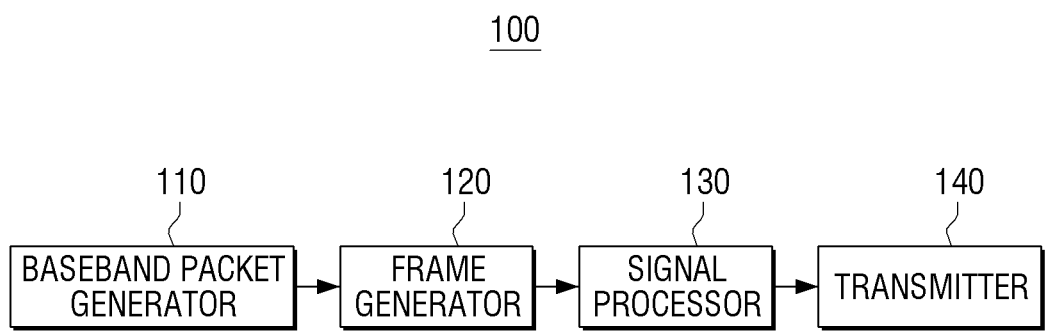
FIG. 4 is a block diagram illustrating a configuration of a transmitting apparatus, according to an exemplary embodiment.

FIG. 4 is a block diagram illustrating a configuration of a transmitting apparatus, according to an exemplary embodiment.

According to FIG. 4, a transmitting apparatus 100 includes a BBP generator 110, a frame generator 120, a signal processor 130, and a transmitter 140.

The BBP generator 110 may generate a BBP (or an L2 packet) including a header and payload data based on an input stream. The header may include information about payload data included in the BBP, where the header is included, and information regarding at least one packet included in this BBP, which will be described later.

The payload data included in a BBP may include at least one of IP packets, TS packets and signaling packets, or may include a combination of these packets. However, the payload data is not limited thereto, and may further include various types of data.

A BBP may be a unit packet which is necessary for mapping various types of data in physical layers. The BBP may include at least one TS packet according to an exemplary embodiment, which will be described later in detail.

The frame generator 120 may generate a frame including at least one BBP. Here, the generated frame may be a BBF (or an L1 packet) including at least one BBP.

The frame generator 120 may generate a BBF a size of which corresponds to an FEC code by arranging a plurality of BBPs which may include at least one of TS packets, IP packets and a header. The BBP itself may be a TS packet according to an exemplary embodiment, but is not limited thereto. The same process may be applied not only to TS packets but also to various types of data. The process of generating a BBP and a BBF will be described in detail with reference to FIGS. 5A and 5B.

Figure 5A:
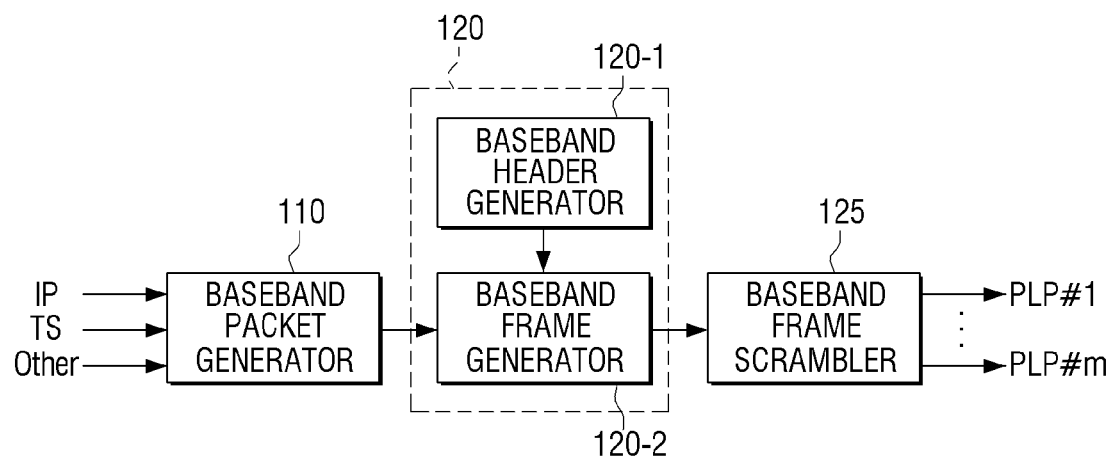
FIG. 5A is a block diagram illustrating a detailed configuration of a frame generator, according to an exemplary embodiment.

FIG. 5A is a block diagram illustrating a detailed configuration of a frame generator, according to an exemplary embodiment.

Referring to FIG. 5A, the frame generator 120 may include a baseband header generator 120-1 and a BBF generator 120-2. The BBF generator 120 may transmit a generated BBF to a BBF scrambler 125.

The BBP generator 110 may generate a BBP to be transmitted to each PLP with respect to an input mode, from at least one of IP packets, TS packets and various types of data. Here, the BBP belongs to an L2 packet in ISO 7 layer model. In other words, the BBP generator 110 may generate a BBP by encapsulating a packet such as an IP packet, a TS packet, etc. input from layer 2 (L2) or a higher layer.

The baseband header generator 120-1 may generate a header which is inserted to a BBF. Here, the header which is inserted in a BBF is referred to as a baseband header, and the baseband header includes information regarding the BBF.

The baseband header generator 120-1 may generate a baseband header which includes information regarding a type of payload data which indicates a type of BBP generated regarding each stream when an input stream is a mixed mode which includes a TS stream and other types of stream such as an IP stream. In addition, the baseband header generator 120-1 may include various information, which will be described later.

Further, the BBF generator 120-2 may generate a BBF by encapsulating a baseband header generated from the baseband header generator 120-1 in at least one BBP output from the BBP generator 110.

The BBF scrambler 125 may generate a scrambled BBF by randomly mixing data stored in a BBF before an FEC code is added in each BBF. The scrambled BBF is transmitted through a PLP to perform signal-processing.

Herein, the PLP indicates a signal path which is processed independently. In other words, each service (for example, video, extended video, audio, data stream, etc.) may be transmitted and received through a plurality of RF channels, and the PLP refers to a path where these services are transmitted or received, or a stream which is transmitted through the path. The PLP may be located at slots which are distributed at time intervals on a plurality of RF channels, or may be distributed at time intervals on one RF channel. In other words, a single PLP may be distributed and transmitted with time intervals on one or a plurality of RF channels.

A PLP has Input Mode A providing one PLP and Input Mode B providing a plurality of PLPs. If Input Mode B is supported, a more robust service can be provided, and also one stream can be distributed and transmitted through a plurality of PLPs, thereby increasing a time interleaving length and obtaining time diversity. If only a specific stream is received, power of a receiver may be turned off when the stream is not received and thus, low power may be used, making it appropriate to provide a portable and mobile broadcast service.

Herein, the time diversity is a technology where the same signal is transmitted several times so that the receiver may synthesize reception signals again and provide superior transmission quality in order to reduce deterioration of transmission quality in a mobile communication transmission path.

In addition, if information which can be transmitted to a plurality of PLPs in common is included in one PLP and transmitted, transmission efficiency can be improved, and PLP0 may play such a role. Such a PLP is referred to as a common PLP, and the PLPs excluding PLP0 may be used for data transmission, and such PLPs are referred to as data PLPs. If such a PLP configuration is used, not only a high definition (HD) TV program is received in a house, but also a standard definition (SD) TV program may be provided even on the move. In addition, not only various broadcast services can be provided to viewers through a broadcast station or a broadcast content provider, but also broadcast can be provided even in a fringe area where reception is poor, providing a differentiated service.

Figure 5B:
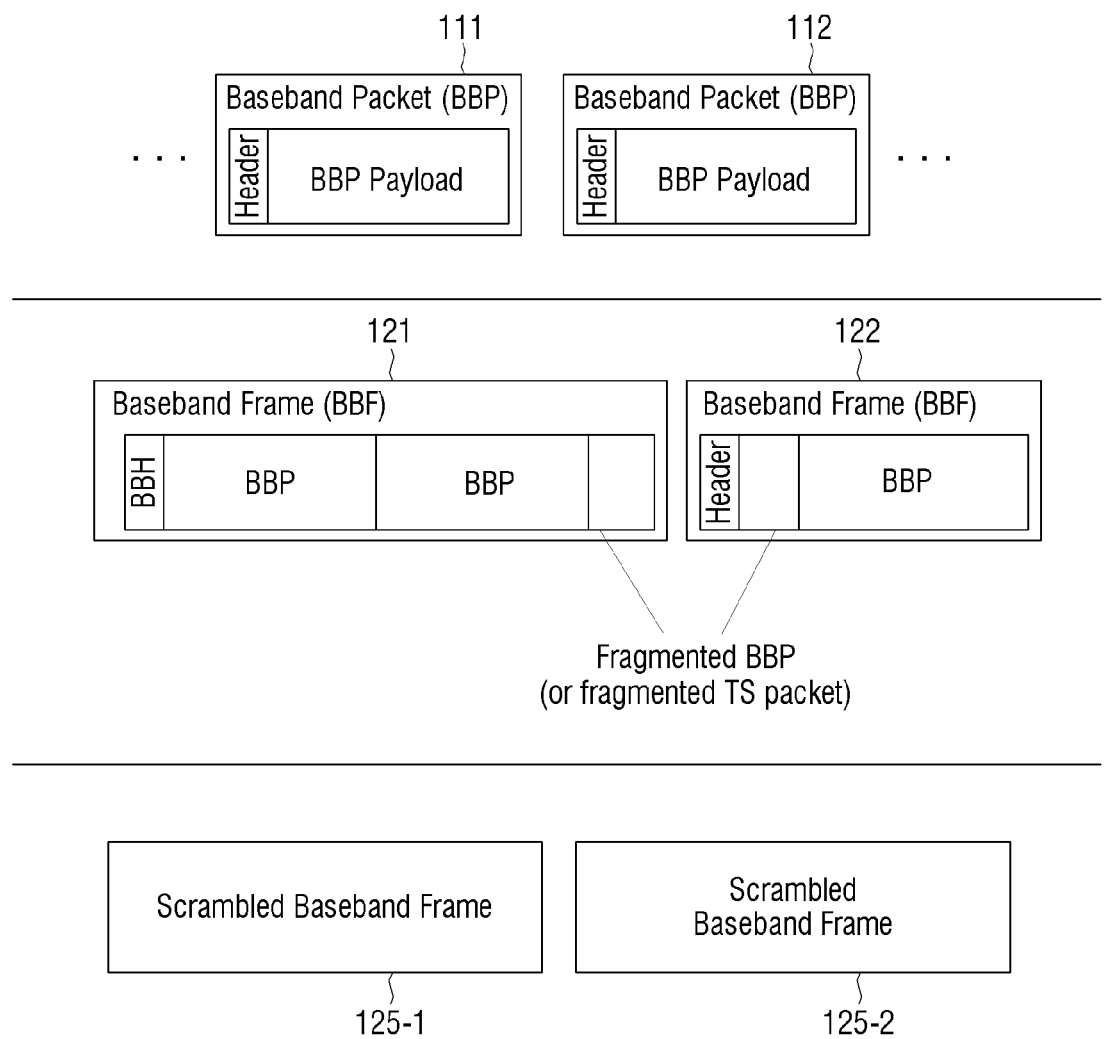
FIG. 5B is a view illustrating a baseband packet, a baseband frame, and a scrambled baseband frame, according to an exemplary embodiment.

Meanwhile, FIG. 5B is a view illustrating a BBP, a BBF, and a scrambled BBF, according to an exemplary embodiment.

Referring to FIG. 5B, the BBP generator 110 generates a plurality of BBPs 111, 112 by storing various types of data such as an IP packet, a TS packet, etc. in a BBP payload and inserting a header, and the BBF generator 120 may generate a plurality of BBFs 121, 122 by grouping the generated plurality of BBPs 111, 112 and inserting a baseband header. Here, each of the BBFs 121, 122 may include a plurality of baseband packets, and may include a fragmented BBP.

The BBF scrambler 125 may generate a plurality of scrambled BBFs 125-1, 125-2 by randomly scrambling each of the generated BBFs 121, 122. The generated scrambled BBFs 125-1, 125-2 are transmitted to a PLP as described above, and signal-processing may be performed to add an FEC code.

Referring back to FIG. 4, the signal processor 130 may perform signal-processing with respect to a generated frame. Herein, the generated frame may refer to a BBF as described above.

Specifically, the signal processor 130 may generate a transmission frame by performing signal-processing a BBF. Here, the transmission frame may refer to the transmission frames 361, 362 as illustrated in FIG. 3D.

In addition, the signal processor 130 may insert signaling information to the signaling area of a frame. Here, the signaling information may be an L1 signaling signal transmitting an L1 signal for frame synchronization, and the preamble 10 where the L1 signaling information is inserted may include the L1 pre-signaling area 11 and the L1 post-signaling area 12 as illustrated in FIG. 3D. The L1 post-signaling area 12 may include the configurable field 12-1 and the dynamic field 12-2.

The L1 pre-signaling area 11 may include information to interpret L1 post-signaling and information regarding an entire transmitting system, and the L1 pre-signaling area may be embodied to have the same length all the time. The L1 post-signaling area 12 may include information and system regarding each PLP, and the L1 signaling area included in each frame of one super frame (FIG. 3D, 370) may have the same length, but contents included therein may change.

The signaling information may include information regarding an input type of an input stream and information regarding a type of data mapped to at least one signal processing path.

The information regarding the input type may indicate whether all signal processing paths in a frame have the same input type.

In addition, the information regarding the input type may include information regarding at least one of a first input type where all signal processing paths transmit only the first type stream in a single mode, a second input type where all signal processing paths transmit the first type stream and a second type stream which is different from the first type stream in a mixed mode, a third input type where all signal processing paths transmit a third type stream which is different from the first type stream and the second type stream in the mixed mode, and a fourth input type where at least two signal processing paths transmit different types of stream.

Here, the first type stream may be a TS stream, the second type stream may be an IP stream, and the third type stream may be a stream which is different in type from the TS stream and the IP stream.

In addition, if at least one signal processing path includes a TS stream, the signaling information may further include at least one of information regarding whether a mode adaptation is used and information regarding an input stream synchronizer (ISSY) mode.

The information regarding the input type of an input stream may be included in the L1 pre-signaling area 11, and the information regarding the data type may be included in the L1 post signaling area 12. Specifically, the information regarding the data type may be included in the configurable field 12-1.

Albeit not illustrated in the drawing, the signal processor 130 may perform a function corresponding to the BICM block 1200 and the structure block 1300 illustrated in FIG. 1.

The transmitter 140 may transmit a signal-processed frame to a receiving apparatus (not shown). Here, the signal-processed frame may refer to the transmission frames 361, 362 illustrated in FIG. 3D.

Specifically, the transmitter 140 may perform a function corresponding to the OFDM waveform generator block 1400 illustrated in FIG. 1. In other words, the transmitter 140 performs modulation to modulate a generated frame to an RF signal, and transmits the RF signal to the receiving apparatus.

Hereinafter, the BBP format will be described in detail with reference to the corresponding drawing, according to an exemplary embodiment.

Figure 6A:
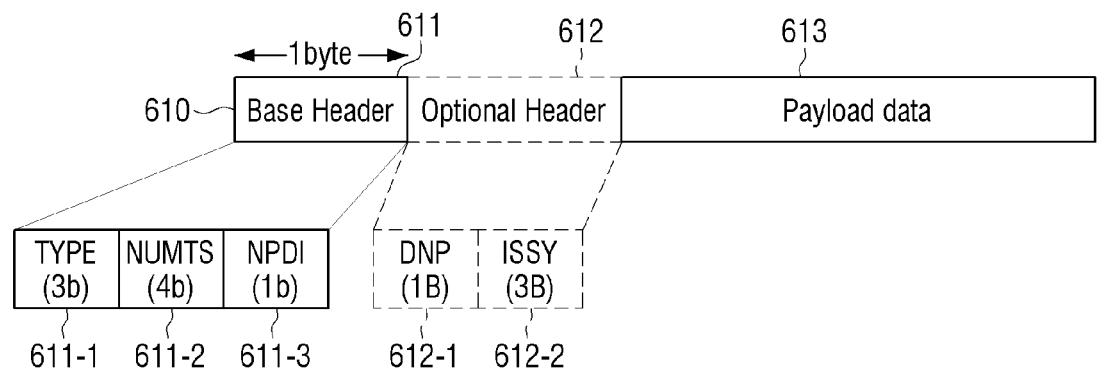
FIGS. 6A and 6B are views illustrating a baseband packet format, according to various exemplary embodiments.
Figure 6B:
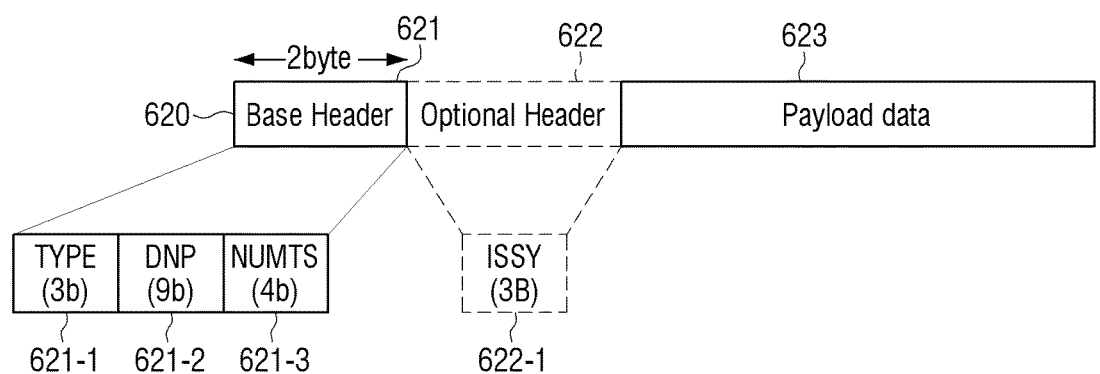

FIGS. 6A and 6B are views illustrating a BBP format according to various exemplary embodiments.

FIGS. 6A and 6B illustrate a BBP format in a mixed mode where an input stream of a corresponding PLP includes a TS stream and an IP or other types of streams different from the TS stream.

In the mixed mode including a TS stream as illustrated in FIG. 6A, a base header 611 of a BBP 610 includes a TYPE field 611-1, an NUMTS field 611-2, an NPDI field 611-3, according to an exemplary embodiment.

Herein, the TYPE field 611-1 represents information regarding a type of payload data 613, and may be realized as a three-bit field.

The TYPE field 611-1 may have values as described in Table 1 below.

TABLE 1

| Value | Description |
|---|---|
| 000 | Padding |
| 001 | Signalling |
| 010 | IPv4 data |

TABLE 1-continued

| Value | Description |
|---|---|
| 011 | IPv6 data |
| 100 | TS data |
| 101 to 111 | Reserved (Generic BBP) |

In other words, if the TYPE field 411 is set to "100", the TYPE field 411 may represent that the payload data includes TS data.

In this regard, BBPs generated from the same TS stream and/or a stream in another input type (for example, IP and signaling) may be multiplexed in the same PLP. In other words, each PLP may include at least one BBP corresponding to at least one input type including a TS input type.

The NUMTS field 611-2 represents the number of TS packets in a corresponding BBP, and may be realized as a four-bit field. Accordingly, a TS packet of as many as 16 can be provided from one BBP. If NUMTS="0", it represents that 16 TS packets are transmitted through the corresponding BBP, and other values may be recognized as the same as the number of the transmitted TS packets. For example, if NUMTS="0001", one TS packet can be transmitted. In another example, NUMTS may represent that "the number of TS packets in the BBP—1".

The NPDI field 611-3 represents whether a corresponding BBP comes after a removed null packet, and may be represented as one-bit field. If a null TS packet is removed before the corresponding BBP, NPDI is set to "1", and the number of removed null packets may be set to one byte DNP counter in an option header which will be described later. On the other hand, if NPDI is set to "0", the one-byte DNP counter can be omitted from the option header. The option header may be referred to as a variable header.

An option header 612 of the BBP 610 includes a DNP field 612-1 and an ISSY field 612-2.

The DNP field 612-1 represents the number of null packets which are removed before a TS packet group in a payload of a corresponding BBP, and may be realized as a one-byte field. The minimum value of DNP may be 1, and the maximum value may be 256 (in another example, the minimum value of DNP may be 0, and the maximum value may be 255. In this case, the number of removed null packets becomes the value of DNP+1. The DNP field 612-1 exists only when the NPDI field 611-3 of the base header 611 is set to "1".

The ISSY field 612-2 represents an input stream clock reference (ISCR) in relation with a TS packet group of the corresponding BBP, and may be realized as a three-byte field. Such clock reference enables the receiving apparatus to restore a TS stream through an accurate timing. The ISSY field 612-2 may be included only in the option header of a first BBP of a corresponding TS stream in a corresponding BBF when the ISSY field 612-2 is set to "1" in the L1 signaling regarding a corresponding PLP (that is, when the ISSY field 612-2 is activated). An ISCR value representing a counter value at a moment when a first TS packet included in a BBP is input to the BBP construction block 1110 may be transmitted through the ISSY field 612-2. Here, the counter operates in a frequency which is known to the transmitting apparatus 100 and the receiving apparatus.

FIG. 6B illustrates a variation of the BBP format shown in FIG. 6A, according to an exemplary embodiment.

As illustrated in FIG. 6B, in a mixed mode including a TS stream, the base header 611 of a BBP 620 includes a TYPE field 621-1, a DNP field 621-2, and an NUMTS field 621-3, and an option header 622 of the BBP 620 includes an ISSY field 622-1. The information that each filed represents has been described above, so further description will not be provided.

As illustrated in FIGS. 6A and 6B, if an ISSY field is included in an option header, an ISCR value representing a counter value at the moment when the first TS packet included in the BBP is input to the BBP construction block 1110 may be transmitted through the ISSY field. Here, the counter operates in a frequency which is known to the transmitting apparatus 100 and the receiving apparatus. The ISSY field may be included only in the first BBP starting in a BBF from among one or more BBPs which constitute the BBF.

The values of each field illustrated in FIGS. 6A and 6B may vary so as to be appropriate for system operation, if necessary, according to an exemplary embodiment.

Figure 7A:
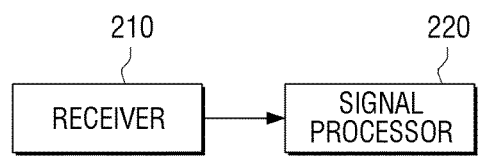
FIG. 7A is a block diagram illustrating a configuration of a receiving apparatus, according to an exemplary embodiment.

FIG. 7A is a block diagram illustrating a configuration of a receiving apparatus, according to an exemplary embodiment.

Referring to FIG. 7A, a receiving apparatus 200 includes a receiver 210 and a signal processor 220.

The receiving apparatus 200 may be configured to receive data from a transmitting apparatus which maps data included in a first type stream and a second type stream to at least one signal processing path and transmits the same.

The receiver 210 receives a frame, i.e., a transmission frame, including data which is mapped to at least one signal processing path. The receiver 210 may receive a stream including signaling information and data which is mapped to at least one signal processing path. The signaling information may include information regarding an input type of an input stream which is input to the transmitting apparatus and information regarding the type of data which is mapped to at least one signal processing path. Here, the information regarding the input type of an input stream may represent whether all signal processing paths in a frame have the same input type. Other specific information included in the signaling information has been described above, so further description will not be provided.

The signal processor 220 extracts the signaling information from the received frame. The signal processor 220 may extract and decode L1 signaling information to obtain various information regarding a corresponding PLP included in an L1 pre-signaling area and an L1 post-signaling area. In addition, the signal processor 220 may perform signal-processing with respect to the frame based on the extracted signaling information. For example, the signal processing may be performed through demodulation, frame de-building, BICM decoding, and input de-processing.

Specifically, the signal processor 220 generates a BBF by performing signal-processing with respect to the frame received from the receiver 210, and extracts header information from a BBP included in the generated baseband frame.

In addition, the signal processor 220 may restore a stream, that is, an input stream which is input for the first time in the above-described transmitting apparatus 100 by performing signal-processing with respect to payload data included in the BBP based on the extracted header information. Here, the extracted header information may include a type of payload data included in the BBP and the number of the first type stream packets in the BBP.

Herein, the first type stream is a TS stream, and the information regarding the type of payload data may be information corresponding to the TS.

In addition, the second type stream may be at least one of an IP packet and a signaling packet.

The header may further include at least one of information regarding whether there exists a null packet removed before the BBP and information regarding the number of null packets removed before a TS packet group in a payload of the BBP and an ISCR in relation with the TS packet group.

In this case, the header includes a base header and an option header, and the information regarding a payload data type, the number of TS stream packets, and whether there exists a null packet removed before the BBP is included in the base header, and the information regarding the number of null packets removed before a TS packet group in a payload of the BBP and an ISCR in relation with the TS packet group may be included in the option header.

Figure 7B:
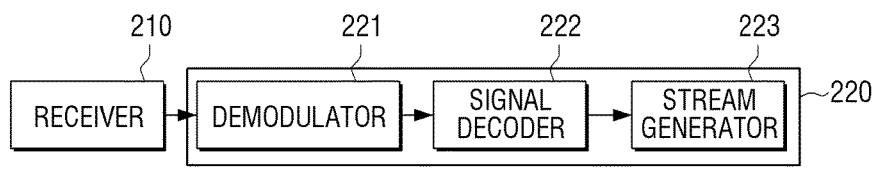
FIG. 7B is a block diagram provided to explain a signal processor in detail, according to an exemplary embodiment.

FIG. 7B is a block diagram provided to explain a signal processor in detail, according to an exemplary embodiment.

According to FIG. 7B, the signal processor 220 includes a demodulator 221, a decoder 222, and a stream generator 223.

The demodulator 221 performs demodulation according to an OFDM parameter from a received RF signal, performs detection of a sync, and if the sync is detected, whether the frame which is currently received is a frame including required service data can be recognized from the signaling information stored in the sync area. For example, whether a mobile frame for a mobile receiver is received or a fixed frame for a fixed receiver is received can be recognized.

In this case, if an OFDM parameter regarding a signaling area and a data area is not predetermined, an OFDM parameter regarding the signaling area and the data area stored in the sync area can be obtained by obtaining information regarding the OFDM parameter regarding the signaling area and the data area which comes right after the sync area to perform demodulation.

The decoder 222 performs decoding with respect to required data. In this case, the decoder 222 may perform decoding by obtaining a parameter such as an FEC method and a modulation method regarding data stored in each data area using the signaling information. In addition, the decoder 222 may calculate a location of the required data based on data information included in a configurable field and a dynamic field. In other words, the decoder 222 may calculate a location of a frame from which a required PLP is transmitted.

The stream generator 223 may generate data to be serviced by processing a BBF input from the decoder 222.

For example, the stream generator 223 may generate a BBP from a BBF where errors are corrected based on ISSY mode, BUFS, TTO value, ISCR value, etc.

Specifically, the stream generator 223 may include de-jitter buffers, and the de-jitter buffers may regenerate an accurate timing to restore an output stream based on an ISSY mode, a buffer size (BUFS) value, a time to output (TTO) value, an ISCR value, etc. Accordingly, a delay for a sync between a plurality of PLPs can be compensated.

Figure 8:
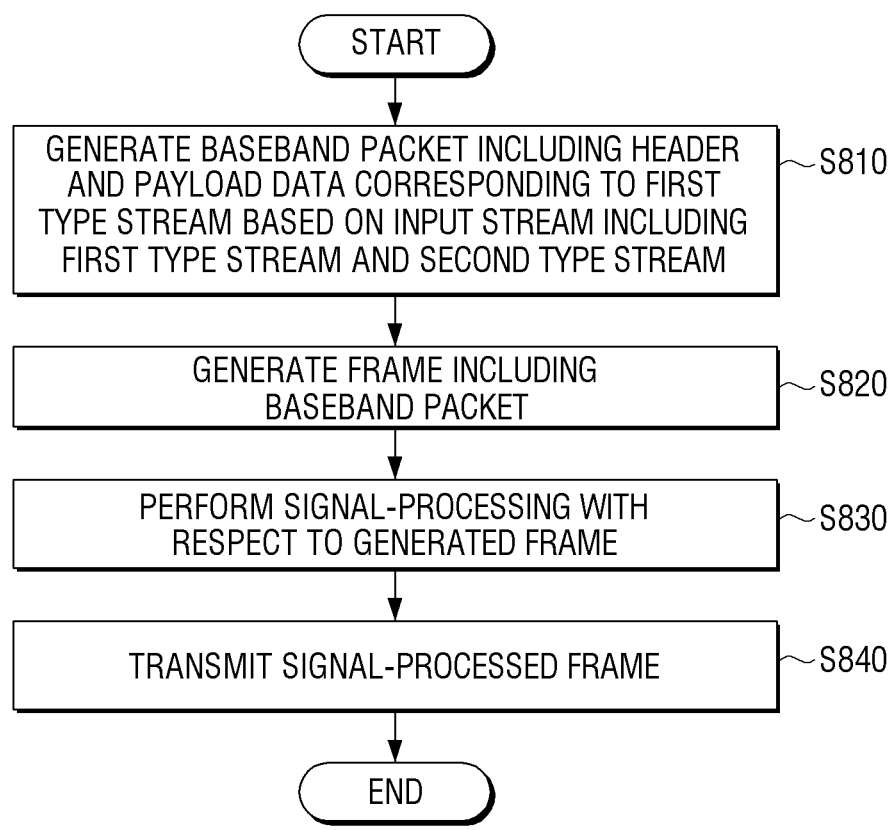
FIG. 8 is a flowchart provided to explain a signal processing method of a transmitting apparatus, according to an exemplary embodiment.

FIG. 8 is a flowchart provided to explain a signal processing method of a transmitting apparatus, according to an exemplary embodiment.

According to the signal processing method of a transmitting apparatus illustrated in FIG. 8, a BBP including a header and payload data corresponding to a first type stream is generated based on an input stream including the first type stream and a second type stream (S810). Here, the header may include to type of payload data and the number of the first type stream packets in the BBP.

Subsequently, a frame including the BBP is generated (S820). Here, the frame may be a baseband frame.

The generated frame is signal-processed (S830).

The signal-processed frame is transmitted (S840). Here, the signal-processed frame may be a transmission frame.

Herein, the first type stream is a TS stream, and the information regarding the type of payload data may have type information corresponding to the TS.

The second type stream may be at least one of an IP packet and a signaling packet.

The header may further include at least one of information regarding whether a null packet removed before the BBP exists and information regarding the number of null packets removed before a TS packet group in a payload of the BBP and an ISCR in relation with the TS packet group.

The header may include a base header and an option header, information regarding a type of payload data, the number of the first type stream packets, and whether a null packet removed before the BBP may be included in the base header, and information regarding the number of null packets removed before the TS packet group in the payload and the ISCR in relation with the TS packet group may be included in the option header.

Operation S830 of performing signal-processing with respect to a generated frame may include generating a transmission frame by performing signal-processing on a generated frame, that is, a BBF, and mapping the first type stream and the second type stream to at least one signal processing path.

Figure 9:
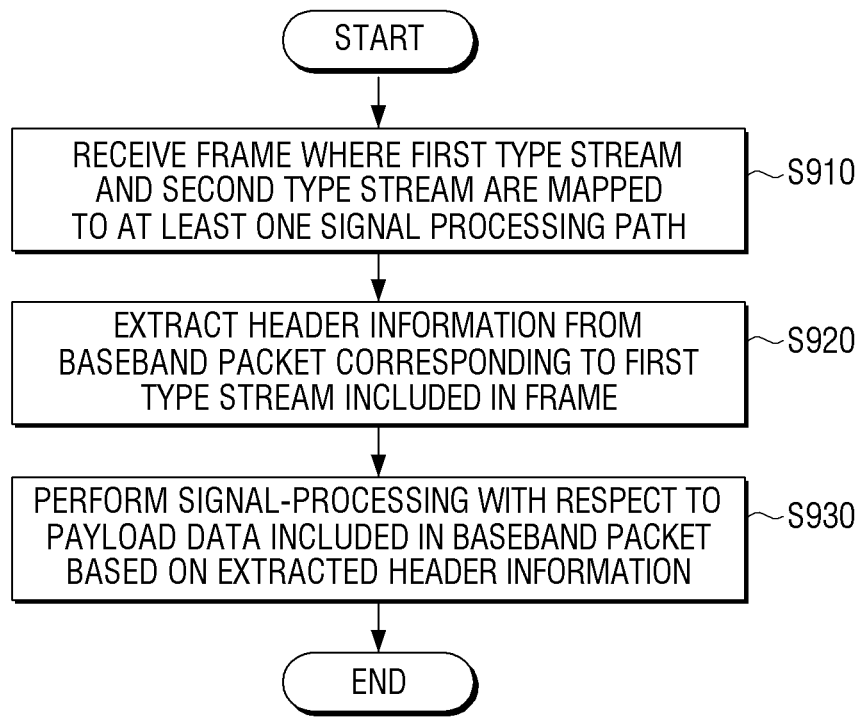
FIG. 9 is a flowchart provided to explain a signal processing method of a receiving apparatus, according to an exemplary embodiment.

FIG. 9 is a flowchart provided to explain a signal processing method of a receiving apparatus, according to an exemplary embodiment.

According to the signal processing method of a receiving apparatus illustrated in FIG. 9, that is, the signal processing method of a receiving apparatus receiving data from a transmitting apparatus, which maps data included in an input stream including a first type stream and a second type stream to at least one signal processing path and transmits the same, a frame where the first type stream and the second type stream are mapped to at least one signal processing path is received (S910).

Subsequently, header information is extracted from a BBP corresponding to the first type stream included in the received frame (S920).

Based on the extracted header information, payload data included in the BBP is signal-processed (S930). Herein, the header information may include information regarding a type of payload data in the BBP and the number of the first type stream packets.

Herein, the first type stream may be a TS stream, the information regarding the type of payload data may be information corresponding to the TS, and the second type stream may be at least one of an IP packet and a signaling packet.

In addition, the header information further include at least one of information regarding whether a null packet removed before the BBP exists and information regarding the number of null packets removed before the TS packet group in the payload and an ISCR in relation with the TS packet group.

The header may include a base header and an option header, information regarding a type of payload data, the number of the first type stream packets, and whether a null packet removed before the BBP may be included in the base header, and information regarding the number of null packets removed before the TS packet group in the payload and the ISCR in relation with the first type stream packet group may be included in the option header.

Figure 10:
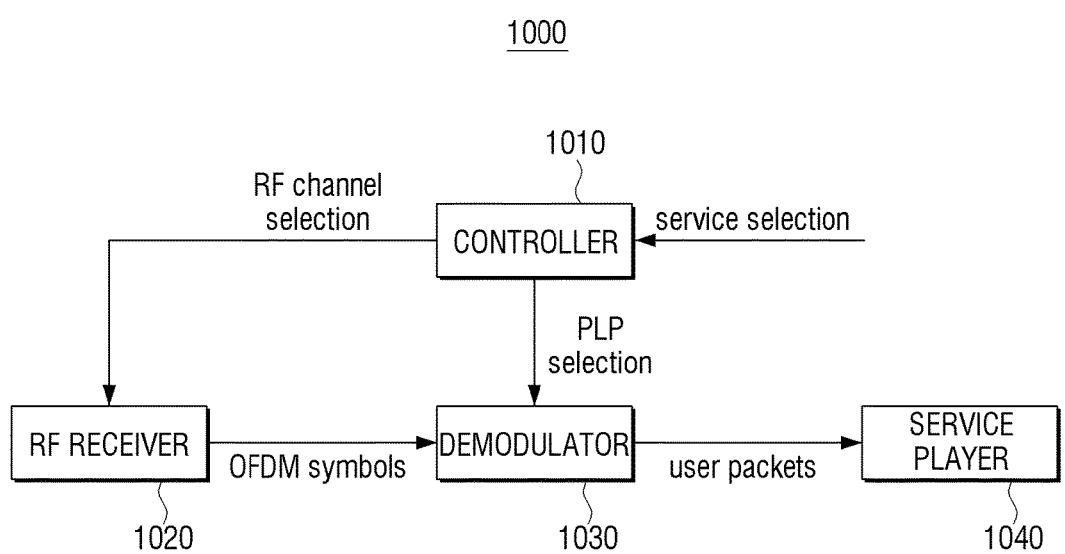
FIG. 10 is a block diagram illustrating configuration of a receiving apparatus, according to an exemplary embodiment.

FIG. 10 is a block diagram illustrating configuration of a receiving apparatus, according to an exemplary embodiment.

Referring to FIG. 10, a receiving apparatus 1000 may include a controller 1010, an RF receiver 1020, a demodulator 1030, and a service player 1040.

The controller 1010 determines an RF channel and a PLP where a selected service is transmitted. In this case, the RF channel may be specified as a center frequency and a bandwidth, and the PLP may be specified as a PLP identifier (ID). A specific service may be transmitted through one or more PLPs which belong to one or more RF channels for each component constituting the service, but in this specification, it is assumed that all data required to reproduce one service is transmitted to one PLP which is transmitted to one RF channel for convenience of explanation. In other words, a service has a unique data acquiring path for reproducing the service, and a data acquiring path is specified as an RF channel and a PLP.

The RF receiver 1020 detects an RF signal from an RF channel selected from the controller 1010, and transmits OFDM symbols extracted by performing signal-processing with respect to the RF signal to the demodulator 1030. Herein, the signal-processing may include synchronization, channel estimation, equalization, etc., and information for performing signal-processing may be a value predetermined by a transmitting apparatus and the receiving apparatus 1000 or may be included in a predetermined specific OFDM symbol from among OFDM symbols depending on use and embodiments, and the information is transmitted from the transmitting apparatus.

The demodulator 1030 performs signal-processing with respect to the OFDM symbols, extracts a user packet, and transmits the same to a service player 1040. The service player 1040 reproduces and outputs a service selected by a user using the user packet. In this case, a format of the user packet may differ according to an embodiment method of the service. For example, the format of the user packet may be a TS packet or an IPv4 packet.

Figure 11:
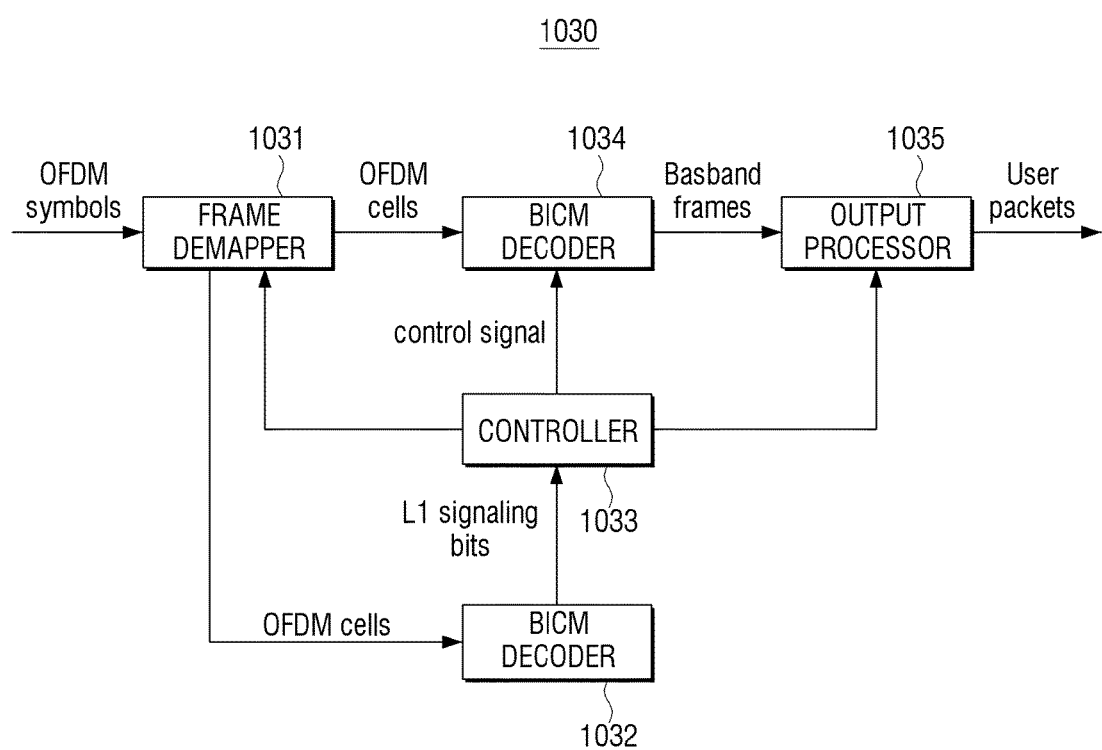
FIG. 11 is a block diagram illustrating a demodulator in greater detail, according to an exemplary embodiment.

FIG. 11 is a block diagram illustrating the demodulator 1030 in greater detail, according to an exemplary embodiment.

Referring to FIG. 11, the demodulator 1030 may include a frame demapper 1031, a BICM decoder 1032 for L1 signaling, a controller 1033, a BICM decoder 1034, and an output processor 1035.

The frame demapper 1031 selects OFDM cells constituting FEC blocks which belong to a PLP selected from frames consisting of OFDM symbols based on control information transmitted from the controller 1030, and transmits the selected OFDM cells to the BICM decoder 1040. In addition, the frame demapper 1031 selects OFDM cells corresponding to one or more FEC blocks included in L1 signaling and transmits the selected OFDM cells to the BICM decoder 1020 for L1 signaling.

The BICM decoder for L1 signaling performs signal-processing with respect to the OFDM cells corresponding to the FEC blocks included in the L1 signaling, extracts L1 signaling bits, and transmits the same to the controller 1030. In this case, the signal-processing may include extracting a log-likelihood ratio (LLR) value for decoding a low density parity check (LDPC) code in the OFDM cells and decoding an LDPC codeword using the extracted LLR value.

The controller 1030 extracts a L1 signaling table from L1 signaling bits, and controls operations of the demapper 1010, the BICM decoder 1040, and the output processor 1050 using a value of the L1 signaling table. FIG. 11 illustrates that the BICM decoder 1020 for L1 signaling does not use the control information of the controller 1030 for convenience of explanation. However, if the L1 signaling has a layer structure similar to the structures of the aforementioned L1 pre signaling and L1 post signaling, the BICM decoder 1020 for L1 signaling may include one or more BICM decoding blocks, and, it is obvious that operations of the BICM decoder 1040 and the frame demapper 1010 may be controlled by upper layer L1 signaling information.

The BICM decoder 1040 extracts BBFs by performing signal-processing with respect to the OFDM cells constituting the FEC blocks which belong to a selected PLP, and transmits the BBFs to the output processor 1050. The signal-processing may include extracting an LLR for LDPC encoding and decoding in the OFDM cells and decoding an LDPC codeword using the extracted LLR value, which may be performed based on control information transmitted from the controller 1030.

The output processor 1050 extracts a user packet by performing signal-processing on BBFs, and transmits the extracted user packets to a service player. In this case, the signal-processing may be performed based on control information transmitted from the controller 1030.

According to an exemplary embodiment, the output processor 1050 includes a BBP packet processor (not shown), and the BBP packet processor (not shown) extracts a BBP from a BBF. Subsequently, if a format of the extracted BBP has a format as illustrated in FIG. 6A (in this case, it can be seen that the corresponding PLP transmits a BBP format as illustrated in FIG. 6A by L1 signaling) and the first three-bit type field of the header of the input BBP is set to "001", the receiving apparatus 1000 can recognize that the next four bits are for an NUMTS field, and the next one bit is for an NPDI filed.

In this case, if NPDI is set to "0", a null packet is not applied to a corresponding BBP, indicating that there is no DNP field in an option al header. If NPDI is set to "1", a TS null packet corresponding to a value set in the DNP is restored in the corresponding BBP and transmitted to the service player 1040.

In addition, a start of payload data may be analyzed by analyzing whether ISSY is applied from L1 signaling and whether an optional header exists from the NPDI setting value, and TS packets (188 bytes) may be restored by inserting a sync byte (0×47) value at a front of each packet in TS packets (187 bytes) which correspond to as many as the values set in the NUMTS and transmitted to the service player 1040.

Figure 12:
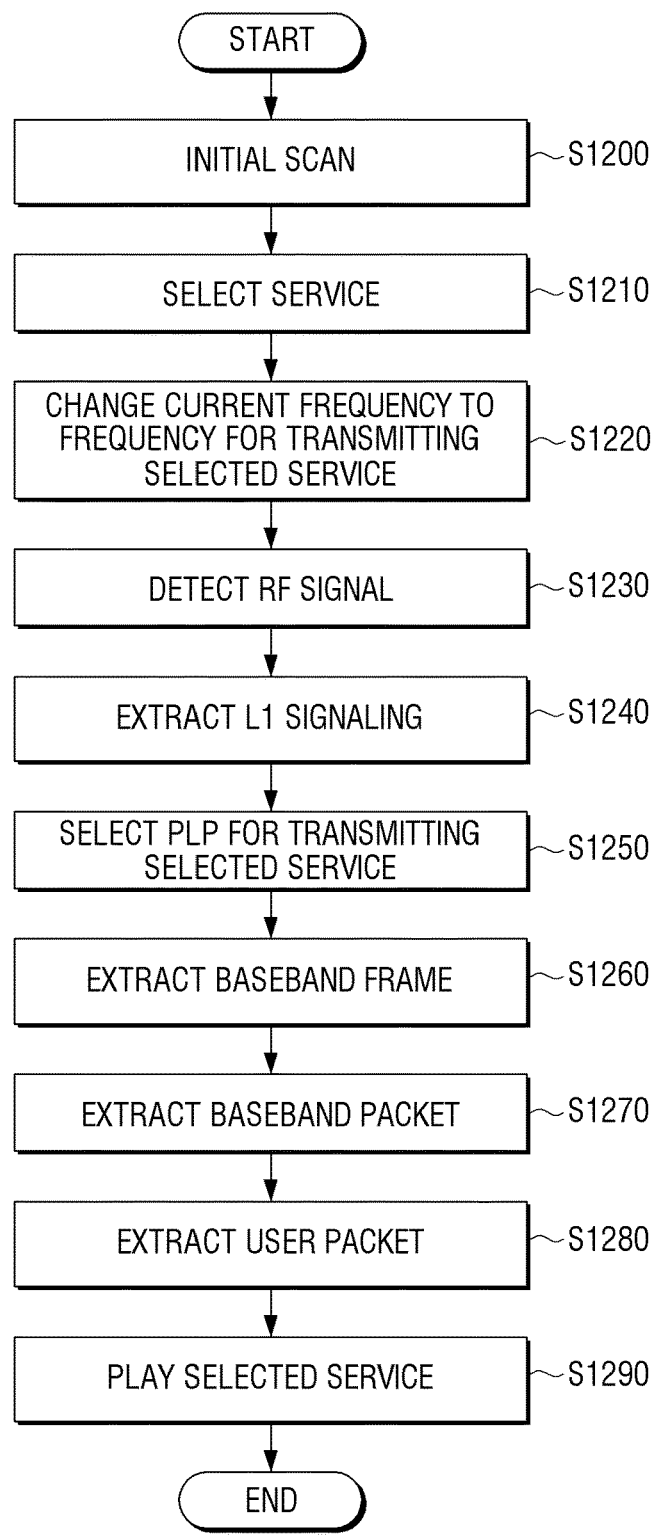
FIG. 12 is a flowchart illustrating an operation of a receiving apparatus from when a user selects a service to when the selected service is actually executed, according to an exemplary embodiment.

FIG. 12 is a flowchart illustrating an operation of a receiving apparatus from when a user selects a service to when the selected service is actually executed, according to an exemplary embodiment.

It is assumed that service information regarding all services available is obtained in an initial scan operation (S1200) before a service selection operation (S1210). Here, the service information may include information regarding an RF channel and a PLP where data required for reproducing a specific service in a current broadcast system is delivered. For example, the service information may be program specific information/service information (PSI/SI) of MPEG2-TS, and generally obtained through L2 signaling and upper layer signaling.

If a user selects a service (S1210), the receiving apparatus changes a current frequency to a frequency for transmitting the selected service (S1220), and performs RF signal detection (S1230). The service information may be used in a process of changing the frequency for the selected service (S1220).

If an RF signal is detected, the receiving apparatus performs an operation of extracting L1 signaling (S1240) from the detected RF signal. Subsequently, the receiving apparatus selects a PLP for transmitting the selected service using the L1 signaling extracted in the previous process (S1250), and extracts a BBF from the selected PLP (S1260). The service information may be used in the process of selecting a PLP for transmission of the selected service (S1250).

The process of extracting a BBF (S1260) may include selecting OFDM cells which belong to a PLP by demapping a transmission frame, extracting an LLR value for LDPC encoding/decoding, and decoding an LDPC codeword using the extracted LLR value.

The receiving apparatus extracts a BBP from the extracted BBF using header information of the extracted BBF (S1270) and then, extracts a user packet from the extracted BBP using header information of the extracted BBP (S1280). The extracted user packet is used to reproduce the selected service (S1290). The L1 signaling information obtained in the operation of extracting L1 signaling (S1240) may be used in the process of extracting the BBP (S1270) and extracting the user packet (S1280). In this case, the process of extracting the user packet from the BBP (a process of restoring a null TS packet and inserting a TS sync byte) is the same as described above.

According to an exemplary embodiment, L1 signaling includes information regarding a type of an input stream, i.e., a user packet which is transmitted through a corresponding PLP and an operation which is used to encapsulate the user packet in a BBF. In this case, corresponding information may be used in a process of extracting the user packet (S1280). The user packet is extracted by performing operations which are used in a process of encapsulation in a reversed manner.

According to an exemplary embodiment, L1 signaling may also include information regarding an ISSY mode, a required buffer size of the receiving apparatus based on the ISSY mode information, and an output time of a first user packet of a corresponding PLP included in the frame. In this case, the corresponding information may be used to control the buffer in the process of extracting the user packet (S1280). The corresponding information may be used to control the size of buffer where the extracted user packet is stored and the time of outputting the user packet to a service player.

As described above, according to various exemplary embodiments, various types of data may be mapped to a transmittable physical layer, thereby improving data processing efficiency.

Meanwhile, a non-transitory computer readable medium where a program for performing the signal processing method according to an exemplary embodiment sequentially may be provided.

The non-transitory computer readable medium refers to a medium which may store data semi-permanently rather than storing data for a short time such as a register, a cache, and a memory and may be readable by an apparatus. Specifically, the non-transitory recordable medium may be a compact disk (CD), digital versatile disk (DVD), hard disk, Blu-ray disk, universal serial bus (USB), memory card, read-only memory (ROM), etc.

The components, elements, modules or units represented by a block as illustrated in FIGS. 1, 2, 4, 5A, 7A, 7B, 10 and 11 may be embodied as various numbers of hardware, software and/or firmware structures that execute respective functions described above, according to an exemplary embodiment. For example, these components, elements, modules or units may use a direct circuit structure, such as a memory, processing, logic, a look-up table, etc. that may execute the respective functions through controls of one or more microprocessors or other control apparatuses. Also, these components, elements, modules or units may be specifically embodied by a program or a part of code, which contains one or more executable instructions for performing specified logic functions. Also, at least one of these components, elements, modules or units may further include a processor such as a central processing unit (CPU) that performs the respective functions, a microprocessor, or the like. Although the above-described block diagrams regarding a transmitting apparatus and a receiving apparatus does not illustrate a bus, communication between each element of the transmitting apparatus and the receiving apparatus may be performed through a bus.

The foregoing embodiments and advantages are merely exemplary and are not to be construed as limiting the inventive concept. The present teaching can be readily applied to other types of apparatuses. Also, the descriptions of the above exemplary embodiments of the inventive concept are intended to be illustrative, and not to limit the scope of the claims, and many alternatives, modifications, and variations will be apparent to those skilled in the art.

What is claimed is:

1. A transmitting method of a transmitting apparatus, the transmitting method comprising:

generating a packet comprising a header and a payload; and transmitting the packet, wherein the header comprises a base header which comprises a first field, a second field and a third field;

wherein the first field comprises a value indicating that a packet type of an input packet is a transport stream (TS) packet, wherein the second field comprises a value indicating a number of non-null TS packets included in the payload, wherein the third field comprises a first value indicating that there is no additional header, or a second value indicating that there is the additional header, wherein if the third field comprises the second value, the additional header includes a fourth field, wherein the fourth field comprises a value indicating a number of at least one deleted null TS packet, and wherein the at least one deleted null TS packet is at least one non-useful TS packet which precedes a first TS packet included in the payload of the packet.

2. The transmitting method of claim 1, wherein the packet is a link-layer protocol packet which is to be mapped to a physical layer before being transmitted out from the transmitting apparatus.

3. The transmitting method of claim 1, wherein the additional header further comprises information about an input stream clock reference in relation with the TS packets.

4. The transmitting method of claim 1, wherein the first field, the second field, and the third field are implemented as a 3-bit field, a 4-bit field, and a 1-bit field, respectively.

5. The signal processing method of claim 1, wherein the TS packets comprise at least one Moving Picture Experts Group 2 (MPEG2) TS packet.

* * * * *